United States Patent
Kim et al.

(10) Patent No.: US 10,147,471 B2
(45) Date of Patent: Dec. 4, 2018

(54) SEMICONDUCTOR DEVICES AND SEMICONDUCTOR SYSTEMS

(71) Applicant: SK hynix Inc., Icheon-si, Gyeonggi-do (KR)

(72) Inventors: Dae Suk Kim, Icheon-si (KR); Jae Il Kim, Yongin-si (KR); Hong Jung Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/625,503

(22) Filed: Jun. 16, 2017

(65) Prior Publication Data
US 2018/0040354 A1    Feb. 8, 2018

(30) Foreign Application Priority Data

Aug. 2, 2016 (KR) .................. 10-2016-0098422
Aug. 2, 2016 (KR) .................. 10-2016-0098423

(51) Int. Cl.
| | |
|---|---|
| *G11C 7/12* | (2006.01) |
| *G11C 7/20* | (2006.01) |
| *G06F 11/22* | (2006.01) |
| *G11C 7/10* | (2006.01) |
| *G11C 7/22* | (2006.01) |
| *H03K 19/20* | (2006.01) |
| *G11C 29/50* | (2006.01) |
| *G11C 29/02* | (2006.01) |

(52) U.S. Cl.
CPC ............ *G11C 7/20* (2013.01); *G06F 11/2205* (2013.01); *G06F 11/2284* (2013.01); *G11C 7/1084* (2013.01); *G11C 7/1087* (2013.01); *G11C 7/1093* (2013.01); *G11C 7/1096* (2013.01); *G11C 7/12* (2013.01); *G11C 7/222* (2013.01); *G11C 29/023* (2013.01); *G11C 29/028* (2013.01); *G11C 29/50008* (2013.01); *H03K 19/20* (2013.01)

(58) Field of Classification Search
CPC .................................... G11C 7/22; G11C 7/12
USPC .................................................. 365/191, 203
See application file for complete search history.

(56) References Cited

U.S. PATENT DOCUMENTS

| | | | |
|---|---|---|---|
| 6,000,004 A * | 12/1999 | Fukumoto ........... | G06F 12/0246 365/185.04 |
| 6,975,547 B2 | 12/2005 | Byeon et al. | |
| 7,475,184 B2 * | 1/2009 | Lee ....................... | G06F 9/4403 711/103 |
| 7,656,722 B2 | 2/2010 | Song | |
| 8,493,809 B2 | 7/2013 | Lee | |

(Continued)

FOREIGN PATENT DOCUMENTS

| | | |
|---|---|---|
| KR | 20150025782 A | 3/2015 |
| KR | 20160023359 A | 3/2016 |

*Primary Examiner* — Michael Tran
(74) *Attorney, Agent, or Firm* — William Park & Associates Ltd.

(57) ABSTRACT

A semiconductor system may include a first semiconductor device and a second semiconductor device. The first semiconductor device may be configured to output a reset signal, command/address signals and data. The second semiconductor device may be configured to generate internal commands, internal addresses and internal data for performing an initialization operation. The second semiconductor device may be configured to store the internal data in a plurality of memory cells selected by the internal commands and the internal addresses.

22 Claims, 11 Drawing Sheets

(56) References Cited

U.S. PATENT DOCUMENTS

| | | | |
|---|---|---|---|
| 9,449,665 B1 | 9/2016 | Kim et al. | |
| 2002/0185337 A1* | 12/2002 | Miura | G11C 5/02 |
| | | | 185/11 |
| 2004/0049629 A1* | 3/2004 | Miura | G06F 11/1068 |
| | | | 711/105 |
| 2004/0090242 A1 | 5/2004 | Lee et al. | |
| 2004/0123036 A1* | 6/2004 | Hammitt | G06F 13/1684 |
| | | | 711/131 |
| 2006/0023515 A1* | 2/2006 | Kishi | G11C 16/0491 |
| | | | 365/52 |
| 2008/0201548 A1* | 8/2008 | Przybylski | G06F 13/4243 |
| | | | 711/171 |
| 2008/0307132 A1* | 12/2008 | Zaks | G06F 13/385 |
| | | | 710/106 |
| 2010/0054059 A1* | 3/2010 | Yoon | G11C 7/1072 |
| | | | 365/194 |
| 2010/0162053 A1* | 6/2010 | Gillingham | G06F 11/10 |
| | | | 714/49 |
| 2012/0182816 A1* | 7/2012 | Ide | G11C 29/56008 |
| | | | 365/200 |
| 2012/0195144 A1* | 8/2012 | Ide | G11C 29/40 |
| | | | 365/200 |
| 2012/0243365 A1* | 9/2012 | Kanda | G11C 8/10 |
| | | | 365/230.06 |
| 2013/0151757 A1* | 6/2013 | Hong Beom | G06F 13/1668 |
| | | | 711/103 |
| 2013/0297894 A1* | 11/2013 | Cohen | G06F 3/0679 |
| | | | 711/154 |
| 2015/0036439 A1 | 2/2015 | Lee | |
| 2016/0071574 A1 | 3/2016 | Hess et al. | |

* cited by examiner

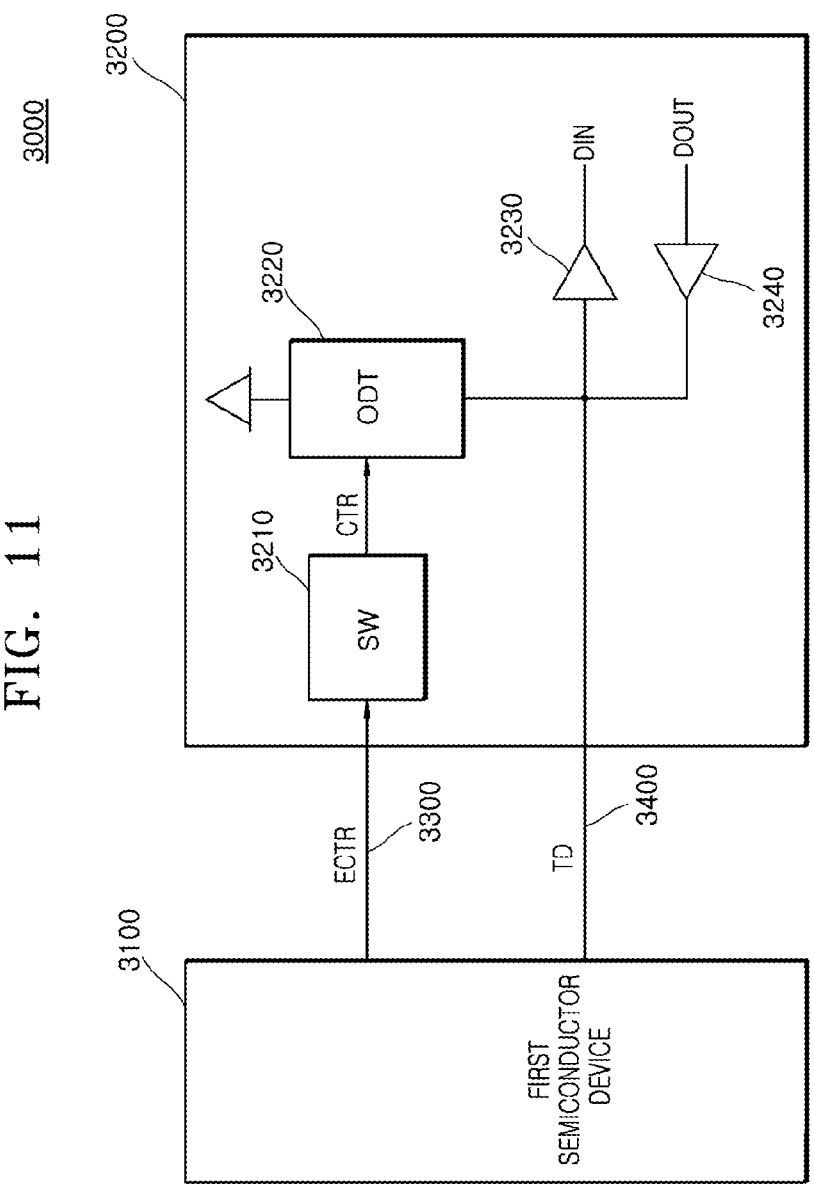

SEMICONDUCTOR DEVICES AND SEMICONDUCTOR SYSTEMS

CROSS-REFERENCE TO RELATED APPLICATION

The present application claims priority under 35 U.S.C 119(a) to Korean Application No. 10-2016-0098422, filed on Aug. 2, 2016 and Korean Application No. 10-2016-0098423, filed on Aug. 2, 2016, which are incorporated herein by reference in its entirety.

BACKGROUND

1. Technical Field

Embodiments of the present disclosure may generally relate to semiconductor devices and semiconductor systems and, more particularly, to semiconductor devices relating to an initialization operation and semiconductor systems relating to the same.

2. Related Art

Internal set values of a semiconductor device have to be initialized to have initial values before the semiconductor device operates. Thus, an initialization operation of the semiconductor device may be very important for normal operations of the semiconductor device.

A chip such as the semiconductor device having various functions may consist of a plurality of circuits, initial conditions of which are necessarily set to perform correct active operations. The initialization operation for setting the initial conditions has to be performed before the active operations of the chip are performed.

In addition, the semiconductor device may store data therein or may output the stored data according to an operation mode. For example, if a controller requires to access data stored in the semiconductor device, the semiconductor may perform a read operation to output the data stored in memory cells corresponding to an address received from the controller. In contrast, if the controller requires to store data into the semiconductor device, the semiconductor may perform a write operation to store the data into the memory cells corresponding to an address received from the controller.

SUMMARY

According to an embodiment, a semiconductor system may be provided. The semiconductor system may include a first semiconductor device and a second semiconductor device. The first semiconductor device may be configured to output a reset signal, command/address signals and data. The second semiconductor device may be configured to generate internal commands, internal addresses and internal data for performing an initialization operation. The second semiconductor device may be configured to store the internal data in a plurality of memory cells selected by the internal commands and the internal addresses.

According to an embodiment, a semiconductor device may be provided. The semiconductor device may be configured to generate internal commands, internal addresses and internal data for performing an initialization operation. The semiconductor device may be configured to store the internal data in a plurality of memory cells selected by the internal commands and the internal addresses.

According to an embodiment, a semiconductor device may be provided. The semiconductor device may include a start signal generation circuit and an initialization operation control circuit. The start signal generation circuit configured to generate an oscillation signal based on a reset signal during an initialization operation. the initialization operation control circuit configured to generate internal commands, internal addresses, and internal data based on the oscillation signal to store the internal data having a same and predetermined logic level into a plurality of memory cells to initialize the plurality of memory cells.

According to an embodiment, wherein the initialization operation control circuit is configured to store the internal data in the plurality of memory cells during the initialization operation.

According to an embodiment, wherein the oscillation signal includes pulses which are periodically created based on the reset signal during the initialization operation.

BRIEF DESCRIPTION OF THE DRAWINGS

FIG. 11 is a block diagram illustrating a representation of an example of a configuration of another electronic system employing the semiconductor device or the semiconductor system illustrated in FIGS. 1 to 9.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices performing an initialization operation and semiconductor systems including the same.

Figure 1:
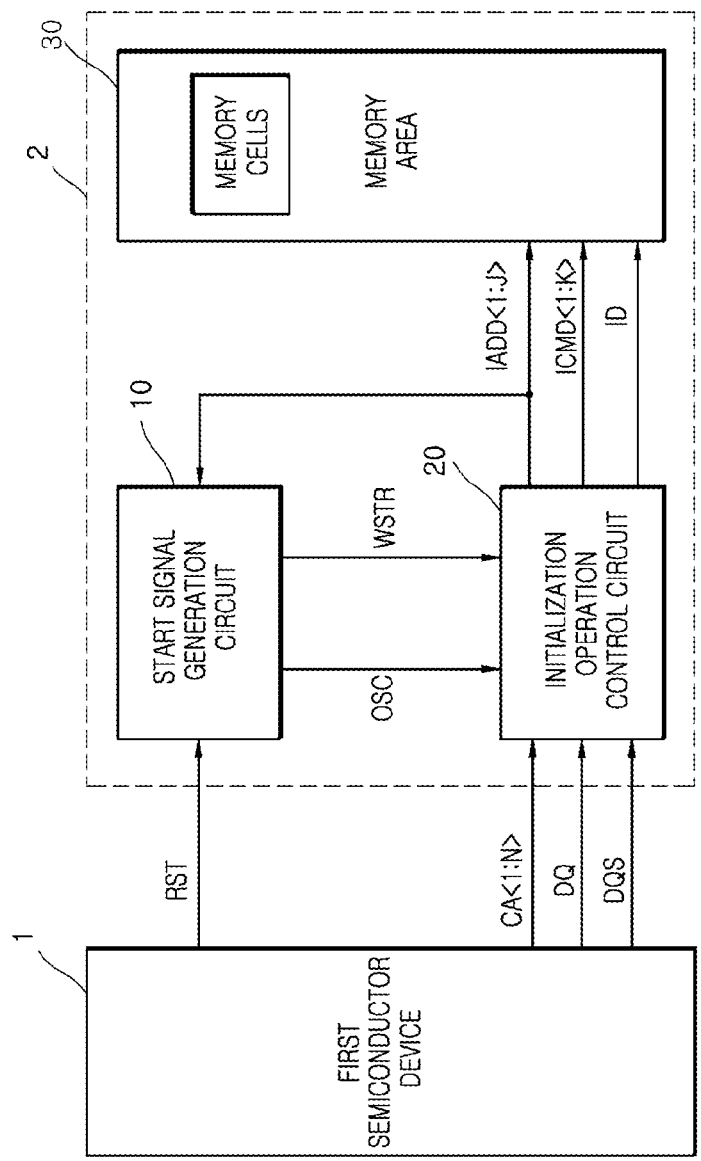
FIG. 1 is a block diagram illustrating a representation of an example of a configuration of a semiconductor system according to an embodiment.

Referring to FIG. 1, a semiconductor system according to an embodiment may include a first semiconductor device 1 and a second semiconductor device 2. The second semiconductor device 2 may include a start signal generation circuit 10, an initialization operation control circuit 20 and a memory area 30.

The first semiconductor device 1 may output a reset signal RST, first to $N^{th}$ command/address signals CA<1:N>, data DQ and a strobe signal DQS. The reset signal RST may be set to be a signal which is enabled to perform an initialization operation of the second semiconductor device 2. The reset signal RST may be set to be a signal which is enabled after a power-up period that a power supply voltage used in the second semiconductor device 2 reaches a target voltage level from a ground voltage level along a level of an external supply voltage. The first to $N^{th}$ command/address signals CA<1:N> and the data DQ may be transmitted through signal lines that transmit at least one group of addresses, commands and data. The number "N" of bits of the first to $N^{th}$ command/address signals CA<1:N> may be set to be a natural number. Some bits of the first to $N^{th}$ command/address signals CA<1:N> may correspond to a command for controlling operations of the second semiconductor device 2. Some other bits of the first to $N^{th}$ command/address signals CA<1:N> may correspond to an address for selecting memory cells of the second semiconductor device 2. Although FIG. 1 illustrates the data DQ line with a single signal line, the data DQ may be set to include a plurality of bits according to the embodiments. The strobe signal DQS may be set to be a signal for strobing the data DQ.

According to an embodiment, the first semiconductor device 1 may transmit the data DQ to the second semiconductor device 2 through a data bus. The first semiconductor device 1 may not transmit the data DQ to the second semiconductor device 2 during the initialization operation. The first semiconductor device 1 may transmit the strobe signal DQS to the second semiconductor device 2. The strobe signal DQS may not be toggled during the initialization operation. The first semiconductor device 1 may calculate a write recovery time tWR from a clock signal (not illustrated) while the initialization operation is performed. The write recovery time tWR may be set to a time period from a point of time that the last data DQ are outputted from the first semiconductor device 1 till a point time that a pre-charge operation is performed.

The start signal generation circuit 10 may generate an oscillation signal OSC including pulses which are periodically created in response to the reset signal RST and may also generate a start signal WSTR which is enabled in response to the reset signal RST. The start signal generation circuit 10 may generate the oscillation signal OSC including the pulses which are periodically created if the reset signal RST is enabled for execution of the initialization operation. The start signal generation circuit 10 may generate the start signal WSTR which is enabled from a point of time that a level of the reset signal RST is changed to perform the initialization operation till a point of time that all of bits of first to $J^{th}$ internal addresses IADD<1:J> are counted. An operation of the start signal generation circuit 10 for generating the start signal WSTR will be described later.

The initialization operation control circuit 20 may generate the first to $J^{th}$ internal addresses IADD<1:J>, first to $K^{th}$ internal commands ICMD<1:K> and internal data ID for the initialization operation in response to the oscillation signal OSC and the start signal WSTR. The initialization operation control circuit 20 may generate the first to $J^{th}$ internal addresses IADD<1:J> which are sequentially counted and the first to $K^{th}$ internal commands ICMD<1:K> which are sequentially counted in response to the pulses of the oscillation signal OSC while the start signal WSTR is enabled. The initialization operation control circuit 20 may generate the internal data ID having predetermined logic levels in response to the pulses of the oscillation signal OSC while the start signal WSTR is enabled. The initialization operation control circuit 20 may stop receiving the first to $N^{th}$ command/address signals CA<1:N> and the data DQ while the start signal WSTR is enabled. The initialization operation control circuit 20 may output the data DQ as the internal data ID in synchronization with the strobe signal DQS after the initialization operation. The number "J" of the bits included in the first to $J^{th}$ internal addresses IADD<1:J> and the number "K" of the bits included in the first to $K^{th}$ internal commands ICMD<1:K> may be set to be natural numbers which are less than the natural number "N". Although FIG. 1 illustrates the internal data ID line with a single signal line, the internal data ID may be set to include a plurality of bits according to the embodiments.

The memory area 30 may include a plurality of memory cells and may store the internal data ID into the memory cells selected by the first to $J^{th}$ internal addresses IADD<1:J> in response to the first to $K^{th}$ internal commands ICMD<1:K>. The memory area 30 may be realized to include a nonvolatile memory device or a volatile memory device according to the embodiments. The internal data ID stored in the memory cells during the initialization operation may have the same logic level. In such a case, the logic level of the internal data ID may be set to a logic "high" level or a logic "low" level according to the embodiments.

The second semiconductor device 2 having an aforementioned configuration may generate the first to $K^{th}$ internal commands ICMD<1:K>, the first to $J^{th}$ internal addresses IADD<1:J> and the internal data ID for performing the initialization operation according to the start signal WSTR generated in response to the reset signal RST. The second semiconductor device 2 may store the internal data ID in the memory cells selected by the first to $K^{th}$ internal commands ICMD<1:K> and the first to $J^{th}$ internal addresses IADD<1:J> during the initialization operation. The second semiconductor device 2 may store the data DQ in the memory cells selected by the first to $N^{th}$ command/address signals CA<1:N> during a write operation after the initialization operation terminates. The second semiconductor device 2 may output the data DQ stored in the memory cells selected by the first to $N^{th}$ command/address signals CA<1:N> during a read operation after the initialization operation terminates.

The second semiconductor device 2 according to an embodiment may include an on-die termination (ODT) circuit (i.e., see FIG. 11) for preventing distortion of the data DQ. The ODT circuit may not be turned on during the initialization operation.

Figure 2:
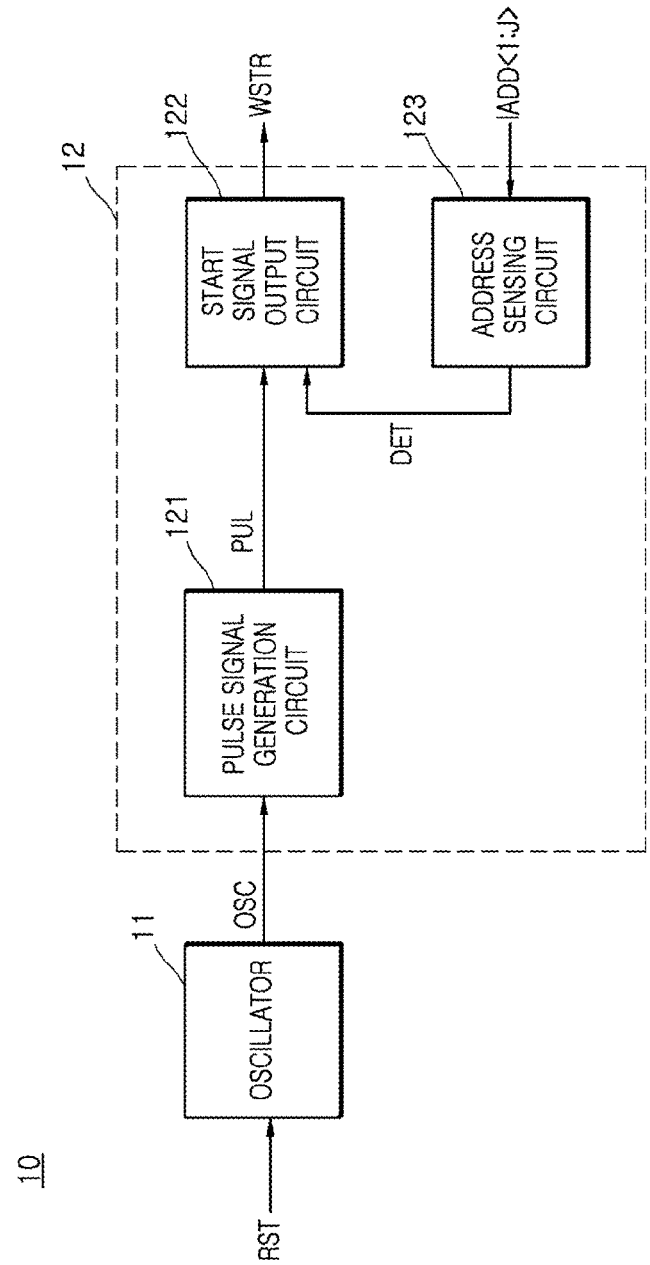
FIG. 2 is a block diagram illustrating a representation of an example of a configuration of an example of a start signal generation circuit included in the semiconductor system of FIG. 1.

Referring to FIG. 2, the start signal generation circuit 10 may include an oscillator 11 and a start signal driving circuit 12. The start signal driving circuit 12 may include a pulse signal generation circuit 121, a start signal output circuit 122 and an address sensing circuit 123.

The oscillator 11 may generate the oscillation signal OSC including the pulses which are periodically created in response to the reset signal RST. The oscillator 11 may generate the oscillation signal OSC including the pulses which are periodically created if a level of the reset signal RST is changed from a logic "low" level into a logic "high" level. The oscillator 11 may be realized using a general ring oscillator or any one of various circuits generating signals having a cycle time. Further, the logic levels of the signals may be different from or the opposite of those described. For example, a signal described as having a logic "high" level may alternatively have a logic "low" level, and a signal described as having a logic "low" level may alternatively have a logic "high" level.

The pulse signal generation circuit 121 may generate a pulse signal PUL including a pulse which is created after a predetermined period in response to the oscillation signal OSC. The pulse signal generation circuit 121 may generate the pulse signal PUL including a pulse which is created when the pulses of the oscillation signal OSC are inputted to the pulse signal generation circuit 121 by a predetermined number of times. The predetermined period may be set to correspond to a boot-up operation period of the second semiconductor device 2 or a period setting information that controls internal operations of the second semiconductor device 2. The pulse signal generation circuit 121 may be realized using an end clock generator 400b as shown in FIG. 1 of U.S. Pat. No. 6,975,547.

The start signal output circuit 122 may generate the start signal WSTR which is enabled in response to the pulse signal PUL and a detection signal DET while the initialization operation is performed. The start signal output circuit 122 may generate the start signal WSTR which is enabled in response to a pulse of the pulse signal PUL and which is disabled in response to a pulse of the detection signal DET. The start signal output circuit 122 may be realized a pulse output unit 222 as shown in FIG. 3 of Pub No. US 2015/0036439.

Figure 9:
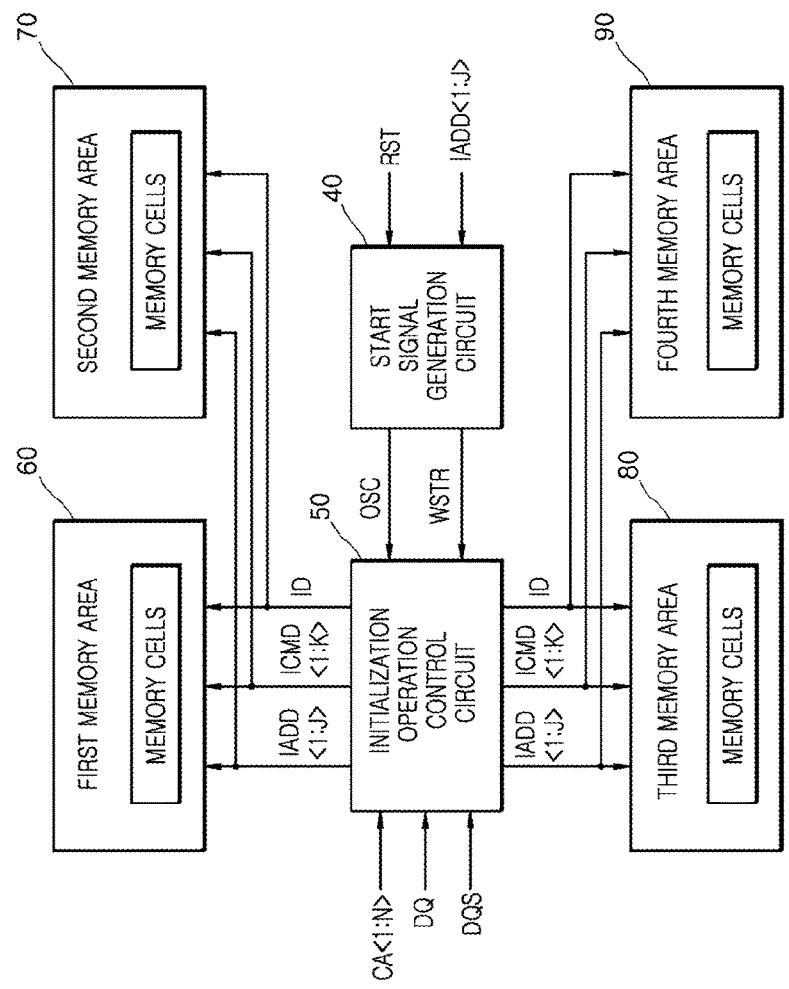
FIG. 9 is a block diagram illustrating a representation of an example of a configuration of a semiconductor device employed in a semiconductor system according to an embodiment.

The address sensing circuit 123 may sense the first to $J^{th}$ internal addresses IADD<1:J> to generate the detection signal DET which is enabled if a combination of the first to $J^{th}$ internal addresses IADD<1:J> is consistent with a predetermined combination. The address sensing circuit 123 may generate the detection signal DET including a pulse which is created if all of bits of the first to $J^{th}$ internal addresses IADD<1:J> are counted. The address sensing circuit 123 may be realized a second address compare circuit 270 as shown in FIG. 9 of U.S. Pat. No. 6,975,547.

The start signal driving circuit 12 having an aforementioned configuration may generate the start signal WSTR which is enabled in response to the oscillation signal OSC and which is disabled if all of bits of the first to $J^{th}$ internal addresses IADD<1:J> are counted.

Figure 3:
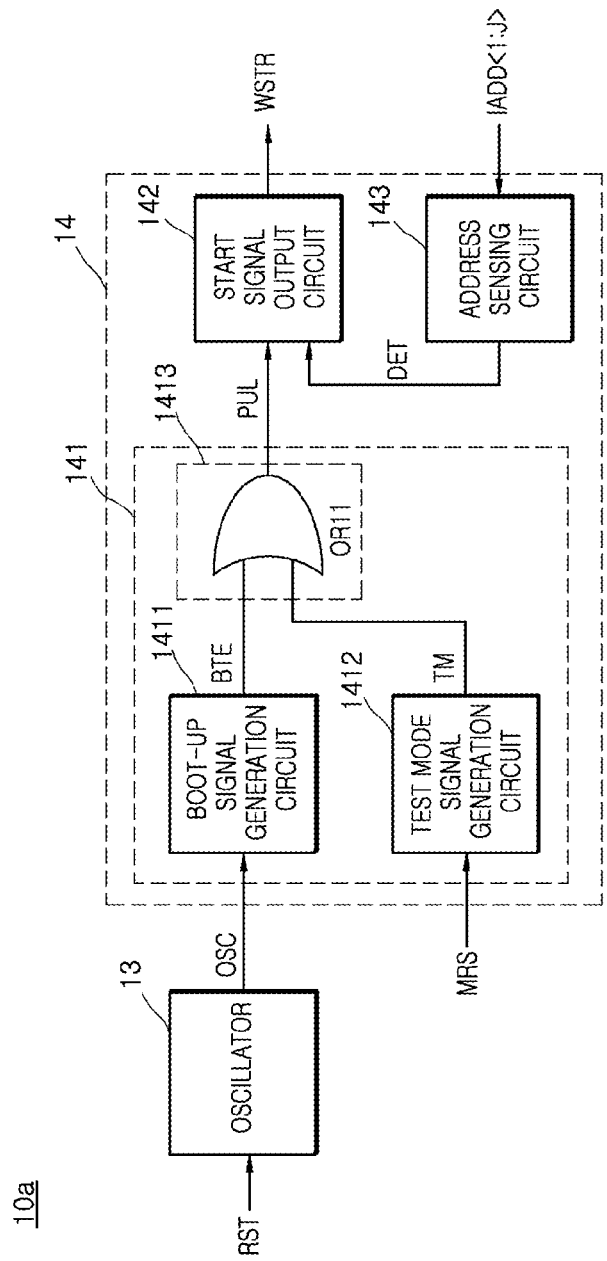
FIG. 3 is a block diagram illustrating a representation of an example of a configuration of another example of a start signal generation circuit included in the semiconductor system of FIG. 1.

Referring to FIG. 3, a start signal generation circuit 10a being able to replace the start signal generation circuit 10 may include an oscillator 13 and a start signal driving circuit 14. The start signal driving circuit 14 may include a pulse signal generation circuit 141, a start signal output circuit 142 and an address sensing circuit 143.

The oscillator 13 may generate the oscillation signal OSC including the pulses which are periodically created in response to the reset signal RST. The oscillator 13 may generate the oscillation signal OSC including the pulses which are periodically created if a level of the reset signal RST is changed from a logic "low" level into a logic "high" level. The oscillator 13 may be realized using a general ring oscillator or any one of various circuits generating signals having a cycle time. Further, the logic levels of the signals may be different from or the opposite of those described. For example, a signal described as having a logic "high" level may alternatively have a logic "low" level, and a signal described as having a logic "low" level may alternatively have a logic "high" level.

The pulse signal generation circuit 141 may include a boot-up signal generation circuit 1411, a test mode signal generation circuit 1412 and a logic circuit 1413.

The boot-up signal generation circuit 1411 may generate a boot-up signal BTE including a pulse which is created after a predetermined period in response to the oscillation signal OSC. The boot-up signal generation circuit 1411 may generate the boot-up signal BTE including a pulse which is created when the pulses of the oscillation signal OSC are inputted to the boot-up signal generation circuit 1411 by a predetermined number of times. The predetermined period may be set to correspond to a boot-up operation period in which a plurality of fuse data of the second semiconductor device 2 are generated.

The test mode signal generation circuit 1412 may generate a test mode signal TM including a pulse which is created after a predetermined period in response to a mode set signal MRS. The predetermined period may be set to be a period for setting a mode register set that controls internal operations of the second semiconductor device 2.

The logic circuit 1413 may be realized using a logic OR gate OR11 to output the boot-up signal BTE or the test mode signal TM as the pulse signal PUL. The logic circuit 1413 may execute a logical OR operation of the boot-up signal BTE and the test mode signal TM to generate the pulse signal PUL.

The start signal output circuit 142 may generate the start signal WSTR which is enabled in response to the pulse signal PUL and the detection signal DET while the initialization operation is performed. The start signal output circuit 142 may generate the start signal WSTR which is enabled in response to a pulse of the pulse signal PUL and which is disabled in response to a pulse of the detection signal DET.

The address sensing circuit 143 may sense the first to $J^{th}$ internal addresses IADD<1:J> to generate the detection signal DET which is enabled if a combination of the first to $J^{th}$ internal addresses IADD<1:J> is consistent with a predetermined combination. The address sensing circuit 143 may generate the detection signal DET including a pulse which is created if all of bits of the first to $J^{th}$ internal addresses IADD<1:J> are counted.

The start signal driving circuit 14 having an aforementioned configuration may generate the start signal WSTR which is enabled in response to the oscillation signal OSC or the mode set signal MRS and which is disabled if all of the bits of the first to $J^{th}$ internal addresses IADD<1:J> are counted.

Figure 4:
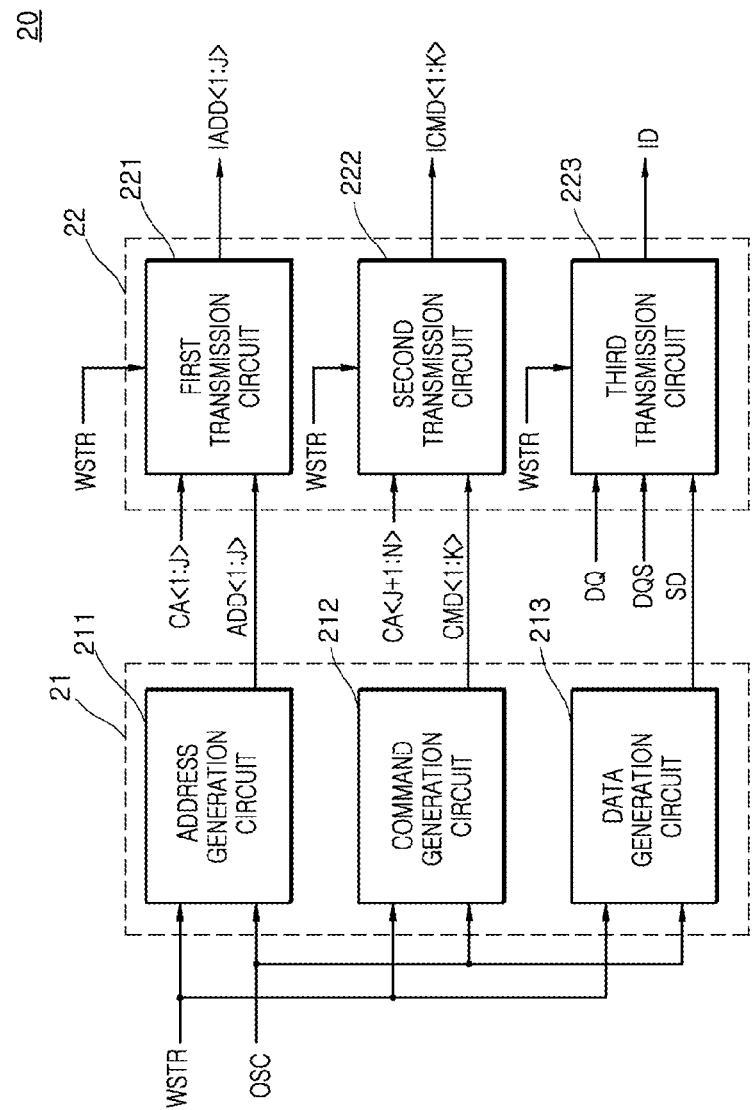
FIG. 4 is a block diagram illustrating a representation of an example of a configuration of an initialization operation control circuit included in the semiconductor system of FIG. 1.

Referring to FIG. 4, the initialization operation control circuit 20 may include an internal signal generation circuit 21 and an input control circuit 22.

The internal signal generation circuit 21 may include an address generation circuit 211, a command generation circuit 212 and a data generation circuit 213.

The address generation circuit 211 may generate first to $J^{th}$ addresses ADD<1:J> that are sequentially counted in response to the pulses of the oscillation signal OSC while the start signal WSTR is enabled. The address generation circuit 211 may count up the first to $J^{th}$ addresses ADD<1:J>, all bits of which have a logic "low" level, whenever every pulse of the oscillation signal OSC is inputted, thereby generating the first to $J^{th}$ addresses ADD<1:J>, all bits of which have a logic "high" level. Further, the logic levels of the signals may be different from or the opposite of those described. For example, a signal described as having a logic "high" level may alternatively have a logic "low" level, and a signal described as having a logic "low" level may alternatively have a logic "high" level. The address generation circuit 211 may be realized an address counting unit 30 as shown in FIG. 3 of U.S. Pat. No. 8,493,809.

The command generation circuit 212 may generate first to $K^{th}$ commands CMD<1:K> in response to the pulses of the oscillation signal OSC while the start signal WSTR is enabled. The command generation circuit 212 may alternatively and repeatedly generate the first to $K^{th}$ commands CMD<1:K> for an active operation and the first to $K^{th}$ commands CMD<1:K> for the write operation, whenever every pulse of the oscillation signal OSC is inputted.

The data generation circuit 213 may generate storage data SD having a predetermined logic level in response to the pulses of the oscillation signal OSC while the start signal WSTR is enabled. The data generation circuit 213 may generate the storage data SD having a logic "low" level whenever every pulse of the oscillation signal OSC is inputted. Alternatively, the data generation circuit 213 may generate the storage data SD having a logic "high" level whenever every pulse of the oscillation signal OSC is inputted, according to the embodiments.

The internal signal generation circuit 21 having an aforementioned configuration may generate the first to $J^{th}$ addresses ADD<1:J> that are sequentially counted, the first to $K^{th}$ commands CMD<1:K> that are sequentially counted, and the storage data SD having a predetermined logic level, in response to the pulses of the oscillation signal OSC while the start signal WSTR is enabled.

The input control circuit 22 may include a first transmission circuit 221, a second transmission circuit 222 and a third transmission circuit 223.

The first transmission circuit 221 may output the first to $J^{th}$ addresses ADD<1:J> or the first to $J^{th}$ command/address signals CA<1:J> as the first to $J^{th}$ internal addresses IADD<1:J> in response to the start signal WSTR. The first transmission circuit 221 may output the first to $J^{th}$ addresses ADD<1:J> as the first to $J^{th}$ internal addresses IADD<1:J> while the start signal WSTR is enabled. The first transmission circuit 221 may output the first to $J^{th}$ command/address signals CA<1:J> as the first to $J^{th}$ internal addresses IADD<1:J> while the start signal WSTR is disabled. The first to $J^{th}$ command/address signals CA<1:J> may be set to include some bits of the first to $N^{th}$ command/address signals CA<1:N>.

The second transmission circuit 222 may output the first to $K^{th}$ commands CMD<1:K> or the $(J+1)^{th}$ to $N^{th}$ command/address signals CA<J+1:N> as the first to $K^{th}$ internal commands ICMD<1:K> in response to the start signal WSTR. The second transmission circuit 222 may output the first to $K^{th}$ commands CMD<1:K> as the first to $K^{th}$ internal commands ICMD<1:K> while the start signal WSTR is enabled. The second transmission circuit 222 may output the $(J+1)^{th}$ to $N^{th}$ command/address signals CA<J+1:N> as the first to $K^{th}$ internal commands ICMD<1:K> while the start signal WSTR is disabled. The $(J+1)^{th}$ to $N^{th}$ command/address signals CA<J+1:N> may be set to include the remaining bits of the first to $N^{th}$ command/address signals CA<1:N> other than the bits of the first to $J^{th}$ command/address signals CA<1:J>. A sum of the number "J" of the bits included in the first to $J^{th}$ internal addresses IADD<1:J> and the number "K" of the bits included in the first to $K^{th}$ commands CMD<1:K> may be set to be equal to the number "N" of the bits included in the first to $N^{th}$ command/address signals CA<1:N>.

The third transmission circuit 223 may output the storage data SD or the data DQ as the internal data ID in response to the start signal WSTR. The third transmission circuit 223 may output the storage data SD as the internal data ID while the start signal WSTR is enabled. The third transmission circuit 223 may output the data DQ as the internal data ID while the start signal WSTR is disabled. The third transmission circuit 223 may output the data DQ as the internal data ID in synchronization with the strobe signal DQS while the start signal WSTR is disabled.

The input control circuit 22 having an aforementioned configuration may output the first to $J^{th}$ addresses ADD<1:J> or the first to $J^{th}$ command/address signals CA<1:J> as the first to $J^{th}$ internal addresses IADD<1:J>, may output the first to $K^{th}$ commands CMD<1:K> or the $(J+1)^{th}$ to $N^{th}$ command/address signals CA<J+1:N> as the first to $K^{th}$ internal commands ICMD<1:K>, and may output the storage data SD or the data DQ as the internal data ID, in response to the start signal WSTR.

Figure 5:
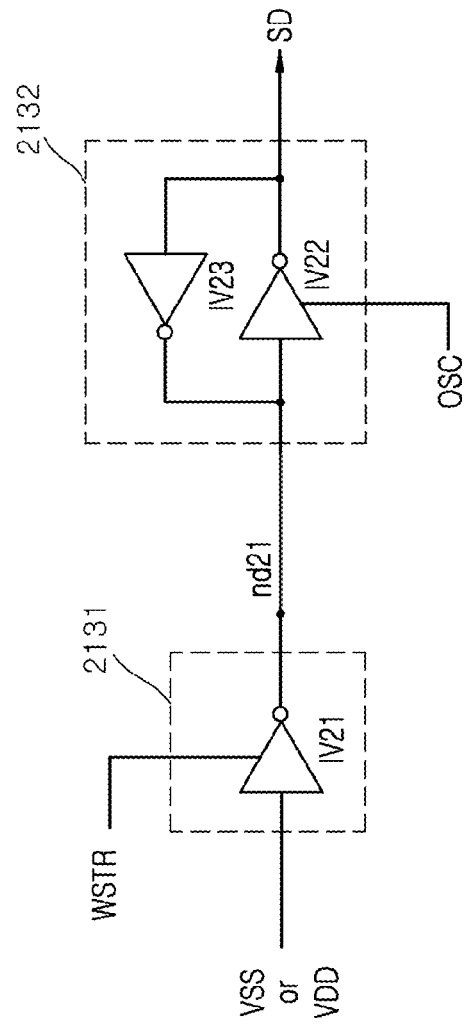
FIG. 5 is a circuit diagram illustrating a representation of an example of a configuration of an example of a data generation circuit included in the initialization operation control circuit of FIG. 4.

Referring to FIG. 5, a data generation circuit 213a corresponding to an example of the data generation circuit 213 of FIG. 4 may include a buffer circuit 2131 and a first latch circuit 2132.

The buffer circuit 2131 may be realized using an inverter IV21 and may inversely buffer a ground voltage VSS or a power supply voltage VDD to output the inversely buffered voltage to a node nd21 in response to the start signal WSTR. The inverter IV21 may be realized using a tri-state inverter. Thus, the inverter IV21 may inversely buffer the ground voltage VSS or the power supply voltage VDD to output the inversely buffered voltage to the node nd21 if the start signal WSTR has a logic "high" level. The buffer circuit 2131 may pull up the node nd21 in response to the ground voltage VSS if the start signal WSTR has a logic "high" level. The buffer circuit 2131 may pull down the node nd21 in response to the power supply voltage VDD if the start signal WSTR has a logic "high" level.

The first latch circuit 2132 may be realized using inverters IV22 and IV23 and may inversely buffer and latch a signal of the node nd21 to generate the storage data SD in response to the pulses of the oscillation signal OSC. That is, the first latch circuit 2132 may inversely buffer and latch a signal of the node nd21 to generate the storage data SD. The first latch circuit 2132 may be realized using a general latch circuit including the two inverters IV22 and IV23. The inverter IV22 may be realized using a tri-state inverter and may inversely buffer a signal of the node nd21 to generate the storage data SD if the pulses (having a logic "high" level) of the oscillation signal OSC are inputted. Further, the logic levels of the signals may be different from or the opposite of those described. For example, a signal described as having a logic "high" level may alternatively have a logic "low" level, and a signal described as having a logic "low" level may alternatively have a logic "high" level.

The data generation circuit 213a having an aforementioned configuration may generate the storage data SD having a predetermined logic level in response to the pulses of the oscillation signal OSC while the start signal WSTR is enabled.

Figure 6:
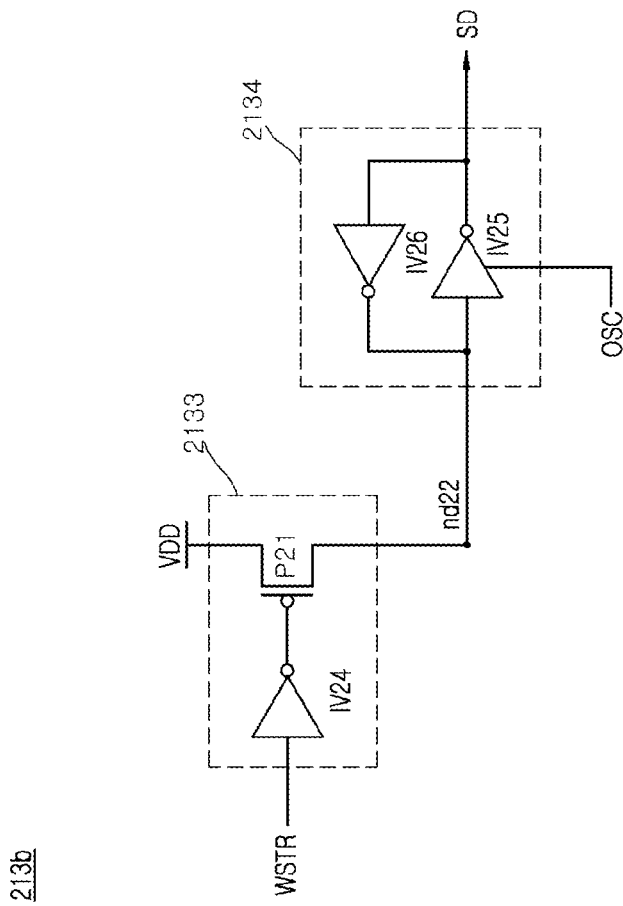
FIG. 6 is a circuit diagram illustrating a representation of an example of a configuration of another example of a data generation circuit included in the initialization operation control circuit of FIG. 4.

Referring to FIG. 6, a data generation circuit 213b corresponding to an example of the data generation circuit 213 of FIG. 4 may include a first driving circuit 2133 and a second latch circuit 2134.

The first driving circuit 2133 may be realized to include an inverter IV24 and a PMOS transistor P21 and may pull up a node nd22 to the power supply voltage VDD in response to the start signal WSTR. The first driving circuit 2133 may be coupled between a power supply voltage VDD terminal and the node nd22 to pull up the node nd22 to the power supply voltage VDD in response to the start signal WSTR. The first driving circuit 2133 may drive the node nd22 to have the power supply voltage VDD if the start signal WSTR has a logic "high" level. Further, the logic levels of the signals may be different from or the opposite of those described. For example, a signal described as having a logic "high" level may alternatively have a logic "low" level, and a signal described as having a logic "low" level may alternatively have a logic "high" level.

The second latch circuit 2134 may be realized using inverters IV25 and IV26 and may inversely buffer and latch a signal of the node nd22 to generate the storage data SD in response to the pulses of the oscillation signal OSC. That is, the second latch circuit 2134 may inversely buffer and latch a signal of the node nd22 to generate the storage data SD. The second latch circuit 2134 may be realized using a general latch circuit including the two inverters IV25 and IV26. The inverter IV25 may be realized using a tri-state inverter and may inversely buffer a signal of the node nd22 to generate the storage data SD if the pulses (having a logic "high" level) of the oscillation signal OSC are inputted.

The data generation circuit 213b having an aforementioned configuration may generate the storage data SD having a logic "low" level in response to the pulses of the oscillation signal OSC while the start signal WSTR is enabled. Further, the logic levels of the signals may be different from or the opposite of those described. For example, a signal described as having a logic "high" level may alternatively have a logic "low" level, and a signal described as having a logic "low" level may alternatively have a logic "high" level.

Figure 7:
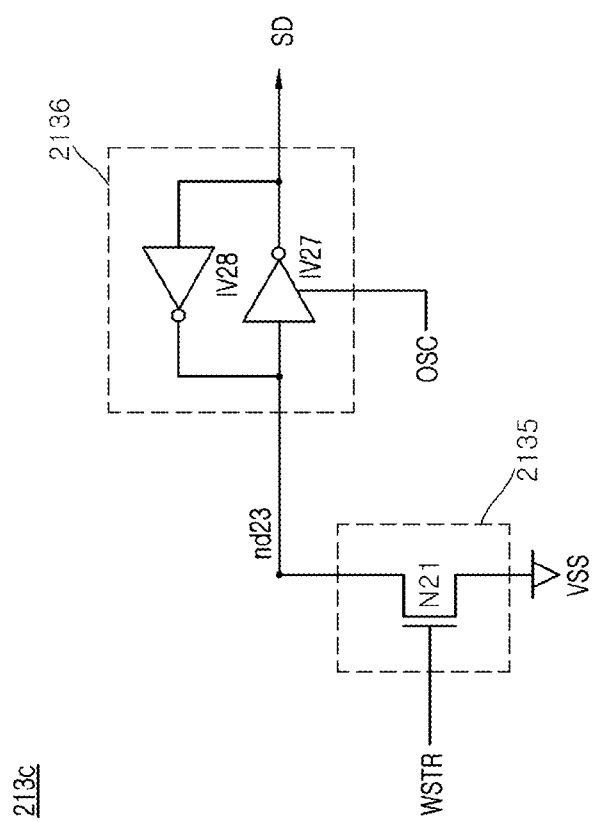
FIG. 7 is a circuit diagram illustrating a representation of an example of a configuration of an example of a data generation circuit included in the initialization operation control circuit of FIG. 4.

Referring to FIG. 7, a data generation circuit 213c corresponding to an example of the data generation circuit 213 of FIG. 4 may include a second driving circuit 2135 and a third latch circuit 2136.

The second driving circuit 2135 may be realized to include an NMOS transistor N21 and may pull down a node nd23 to the ground voltage VSS in response to the start signal WSTR. The second driving circuit 2135 may be coupled between the node nd23 and a ground voltage VSS terminal to pull up the node nd23 to the ground voltage VSS in response to the start signal WSTR. The second driving circuit 2135 may drive the node nd23 to have the ground voltage VSS if the start signal WSTR has a logic "high" level. Further, the logic levels of the signals may be different from or the opposite of those described. For example, a signal described as having a logic "high" level may alternatively have a logic "low" level, and a signal described as having a logic "low" level may alternatively have a logic "high" level.

The third latch circuit 2136 may be realized using inverters IV27 and IV28 and may inversely buffer and latch a signal of the node nd23 to generate the storage data SD in response to the pulses of the oscillation signal OSC. That is, the third latch circuit 2136 may inversely buffer and latch a signal of the node nd23 to generate the storage data SD. The third latch circuit 2136 may be realized using a general latch circuit including the two inverters IV27 and IV28. The inverter IV27 may be realized using a tri-state inverter and may inversely buffer a signal of the node nd23 to generate the storage data SD if the pulses (having a logic "high" level) of the oscillation signal OSC are inputted. Further, the logic levels of the signals may be different from or the opposite of those described. For example, a signal described as having a logic "high" level may alternatively have a logic "low" level, and a signal described as having a logic "low" level may alternatively have a logic "high" level.

The data generation circuit 213c having an aforementioned configuration may generate the storage data SD having a logic "high" level in response to the pulses of the oscillation signal OSC while the start signal WSTR is enabled. Further, the logic levels of the signals may be different from or the opposite of those described. For example, a signal described as having a logic "high" level may alternatively have a logic "low" level, and a signal described as having a logic "low" level may alternatively have a logic "high" level.

Figure 8:
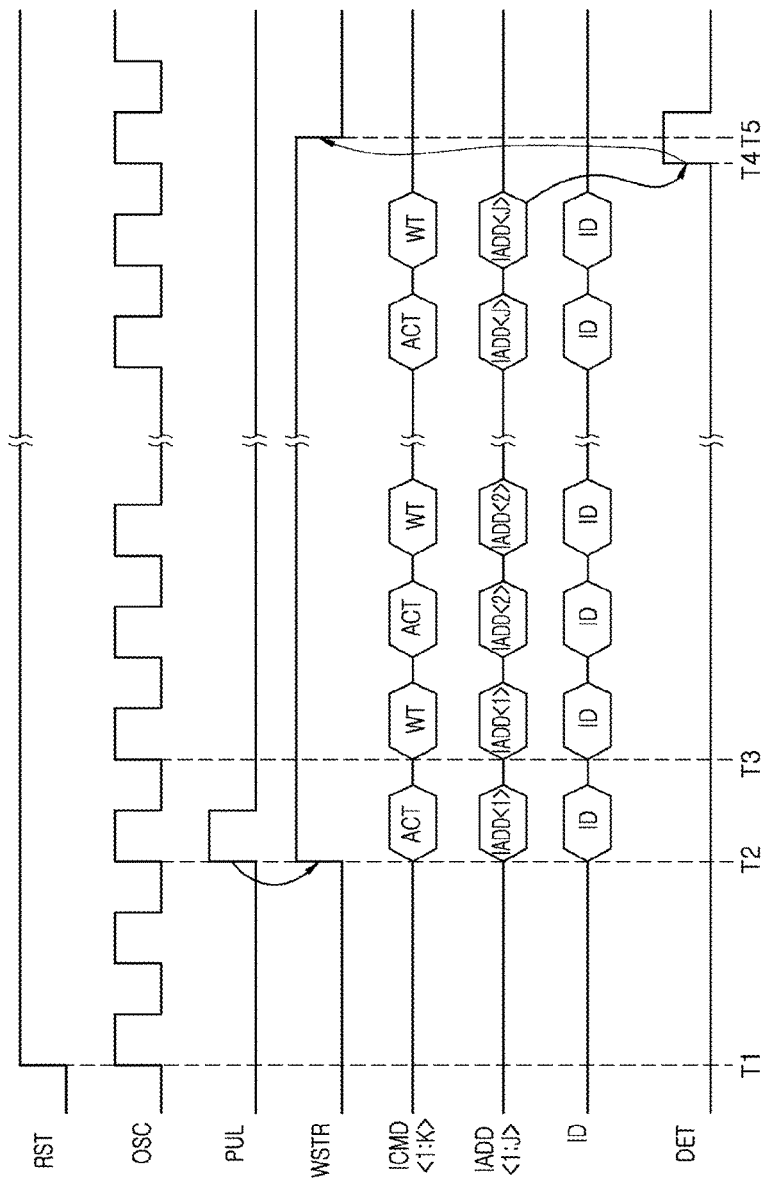
FIG. 8 is a timing diagram illustrating a representation of an example of an operation of a semiconductor system according to an embodiment.

The initialization operation of the semiconductor system having an aforementioned configuration will be described hereinafter with reference to FIG. 8 in conjunction with an operation of storing internal data having the same logic level into a plurality of memory cells.

At a point of time "T1", the first semiconductor device 1 may output the reset signal RST whose level is changed from a logic "low" level into a logic "high" level to perform the initialization operation of the second semiconductor device 2. In such a case, the first semiconductor device 1 may also output the first to $N^{th}$ command/address signals CA<1:N> and the data DQ.

The oscillator 11 may generate the oscillation signal OSC including pulses which are periodically created in response to the reset signal RST.

At a point of time "T2", the pulse signal generation circuit 121 may generate the pulse signal PUL including a pulse which is created after a predetermined period in response to the oscillation signal OSC. The predetermined period may be set to be a period from the point of time "T1" till a point of time (i.e., the point of time "T2") that a time corresponding to two cycles of the oscillation signal OSC elapses from the point of time "Ti". The predetermined period means a boot-up operation period.

The start signal output circuit 122 may generate the start signal WSTR which is enabled to have a logic "high" level in response to the pulse of the pulse signal PUL.

The address generation circuit 211 may generate the first address ADD<1> of the first to $J^{th}$ addresses ADD<1:J> in response to the start signal WSTR having a logic "high" level and a pulse of the oscillation signal OSC.

The command generation circuit 212 may generate the first command CMD<1> of the first to $K^{th}$ commands CMD<1:K> in response to the start signal WSTR having a logic "high" level and a pulse of the oscillation signal OSC. In such a case, the first command CMD<1> may be set to be a command for performing an active operation ACT.

The data generation circuit 213 may generate the storage data SD having a logic "low" level in response to the start signal WSTR having a logic "high" level and a pulse of the oscillation signal OSC. In some embodiments, the data generation circuit 213 may be realized to generate the storage data SD having a logic "high" level.

The first transmission circuit 221 may output the first address ADD<1> as the first internal address IADD<1> in response to the start signal WSTR having a logic "high" level. In such a case, the first transmission circuit 221 may stop receiving the first to $J^{th}$ command/address signals CA<1:J> in response to the start signal WSTR having a logic "high" level.

The second transmission circuit 222 may output the first command CMD<1> as the first internal command ICMD<1> in response to the start signal WSTR having a logic "high" level. The first internal command ICMD<1> may correspond to a command for performing the active operation ACT. In such a case, the second transmission circuit 222 may stop receiving the (J+1)$^{th}$ to N$^{th}$ command/address signals CA<J+1:N> in response to the start signal WSTR having a logic "high" level.

The third transmission circuit 223 may output the storage data SD as the internal data ID in response to the start signal WSTR having a logic "high" level. In such a case, the third transmission circuit 223 may stop receiving the data DQ in response to the start signal WSTR having a logic "high" level.

The memory area 30 may activate a word line connected to the first memory cell among the plurality of memory cells, in response to the first internal command ICMD<1> for performing the active operation ACT and the first internal address IADD<1>.

At a point of time "T3", the address generation circuit 211 may generate the first address ADD<1> of the first to J$^{th}$ addresses ADD<1:J> in response to the start signal WSTR having a logic "high" level and a pulse of the oscillation signal OSC.

The command generation circuit 212 may generate the first command CMD<1> of the first to K$^{th}$ commands CMD<1:K> in response to the start signal WSTR having a logic "high" level and a pulse of the oscillation signal OSC. In such a case, the first command CMD<1> may be set to be a command for performing a write operation WT.

The data generation circuit 213 may generate the storage data SD having a logic "low" level in response to the start signal WSTR having a logic "high" level and a pulse of the oscillation signal OSC. In some embodiments, the data generation circuit 213 may be realized to generate the storage data SD having a logic "high" level.

The first transmission circuit 221 may output the first address ADD<1> as the first internal address IADD<1> in response to the start signal WSTR having a logic "high" level. In such a case, the first transmission circuit 221 may stop receiving the first to J$^{th}$ command/address signals CA<1:J> in response to the start signal WSTR having a logic "high" level.

The second transmission circuit 222 may output the first command CMD<1> as the first internal command ICMD<1> in response to the start signal WSTR having a logic "high" level. The first internal command ICMD<1> may correspond to a command for performing the write operation WT. In such a case, the second transmission circuit 222 may stop receiving the (J+1)$^{th}$ to N$^{th}$ command/address signals CA<J+1:N> in response to the start signal WSTR having a logic "high" level.

The third transmission circuit 223 may output the storage data SD as the internal data ID in response to the start signal WSTR having a logic "high" level. In such a case, the third transmission circuit 223 may stop receiving the data DQ in response to the start signal WSTR having a logic "high" level.

The memory area 30 may store the internal data ID in the first memory cell among the plurality of memory cells, in response to the first internal command ICMD<1> for performing the write operation WT and the first internal address IADD<1>.

After the point of time "T3", the second semiconductor device 2 may sequentially store the internal data ID in the plurality of memory cells according to the second to K$^{th}$ internal commands ICMD<2:K> and the second to J$^{th}$ internal addresses IADD<2:J>.

At a point of time "T4", The address sensing circuit 123 may generate the detection signal DET including a pulse which is created by the first to J$^{th}$ internal addresses IADD<1:J>, all bits of the which are counted.

At a point of time "T5", the start signal output circuit 122 may generate the start signal WSTR which is disabled to have a logic "low" level in response to the pulse of the detection signal DET.

After the point of time "T5", the second semiconductor device 2 may perform a normal operation in response to the first to N$^{th}$ command/address signals CA<1:N> and the data DQ which are outputted from the first semiconductor device 1.

The semiconductor system according to an aforementioned configuration may internally generate an oscillation signal and may generate internal commands, internal addresses and internal data in response to the oscillation signal to store the internal data having the same logic level into a plurality of memory cells of the semiconductor system, during an initialization operation. As a result, the plurality of memory cells of the semiconductor system may be initialized.

Referring to FIG. 9, a semiconductor device employed in a semiconductor system according to an embodiment may include a start signal generation circuit 40, an initialization operation control circuit 50, a first memory area 60, a second memory area 70, a third memory area 80 and a fourth memory area 90.

The start signal generation circuit 40 may generate an oscillation signal OSC including pulses which are periodically created in response to a reset signal RST and may also generate a start signal WSTR which is enabled in response to the reset signal RST. The start signal generation circuit 40 may generate the oscillation signal OSC including the pulses which are periodically created if the reset signal RST is enabled for execution of an initialization operation. The start signal generation circuit 40 may generate the start signal WSTR which is enabled from a point of time that a level of the reset signal RST is changed to perform the initialization operation till a point of time that all of bits of first to J$^{th}$ internal addresses IADD<1:J> are counted. The start signal generation circuit 40 may be realized to have the same configuration as the start signal generation circuit 10 described with reference to FIG. 2 to perform the same operation as the start signal generation circuit 10. Thus, a description of the start signal generation circuit 40 will be omitted hereinafter.

The initialization operation control circuit 50 may generate first to J$^{th}$ internal addresses IADD<1:J>, first to K$^{th}$ internal commands ICMD<1:K> and internal data ID for the initialization operation in response to the oscillation signal OSC and the start signal WSTR. The initialization operation control circuit 50 may generate the first to J$^{th}$ internal addresses IADD<1:J> and the first to K$^{th}$ internal commands ICMD<1:K> which are sequentially counted in response to the pulses of the oscillation signal OSC while the start signal WSTR is enabled. The initialization operation control circuit 50 may generate the internal data ID having predetermined logic levels in response to the pulses of the oscillation signal OSC while the start signal WSTR is enabled. The initialization operation control circuit 50 may stop receiving first to N$^{th}$ command/address signals CA<1:N> and data DQ while the start signal WSTR is enabled. The initialization operation control circuit 50 may output the data DQ as the internal data ID in synchronization with a strobe signal DQS after the initialization operation. The initialization operation control circuit may be realized to have the same configuration as the initialization operation control circuit 20 described with reference to FIG. 4 to perform the same operation as the initialization operation control circuit 20. Thus, a description of the initialization operation control circuit 50 will be omitted hereinafter.

Each of the first to fourth memory areas 60, 70, 80 and 90 may include a plurality of memory cells and may store the internal data ID into the memory cells selected by the first to $J^{th}$ internal addresses IADD<1:J> in response to the first to $K^{th}$ internal commands ICMD<1:K>. Each of the first to fourth memory areas 60, 70, 80 and 90 may be realized to include a nonvolatile memory device or a volatile memory device according to the embodiments. The internal data ID stored in the memory cells during the initialization operation may have the same logic level. In such a case, the logic level of the internal data ID may be set to a logic "high" level or a logic "low" level according to the embodiments.

The semiconductor system according to an embodiment may internally generate an oscillation signal and may generate internal commands, internal addresses and internal data in response to the oscillation signal to store the internal data having the same logic level into a plurality of memory areas of the semiconductor system, during an initialization operation. As a result, the plurality of memory areas of the semiconductor system may be initialized.

Figure 10:
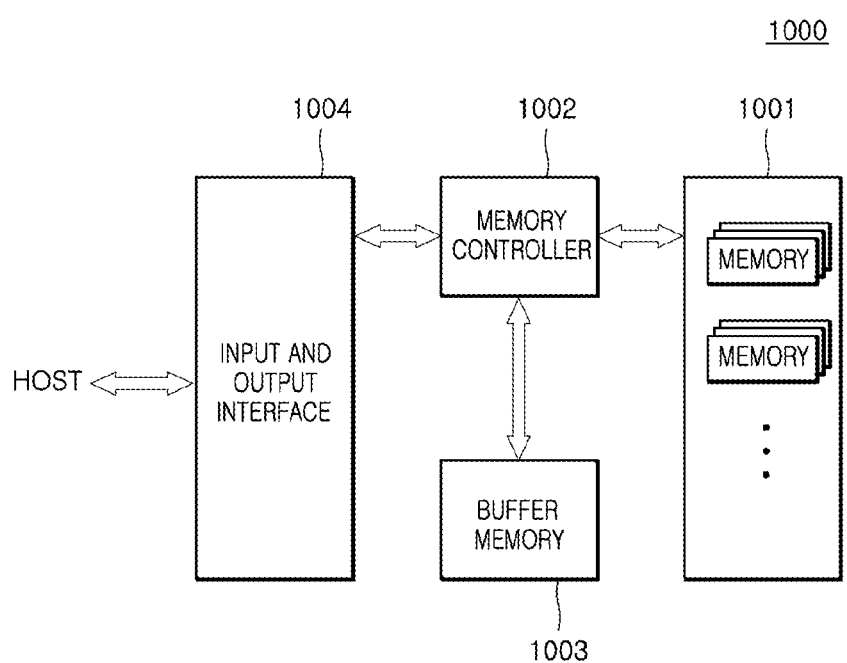
FIG. 10 is a block diagram illustrating a representation of an example of a configuration of an electronic system employing the semiconductor device or the semiconductor system illustrated in FIGS. 1 to 9.

The semiconductor devices or the semiconductor systems described with reference to FIGS. 1 to 9 may be applied to an electronic system that includes a memory system, a graphic system, a computing system, a mobile system, or the like. For example, as illustrated in FIG. 10, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the second semiconductor devices 2 illustrated in FIG. 1 or the semiconductor devices illustrated in FIG. 9. The data storage circuit 1001 may generate internal data having a logic level which is internally set regardless of logic levels of external data and may perform an initialization operation that stores the internal data in a memory cell array included in the data storage circuit 1001. The data storage circuit 1001 may include an ODT circuit (i.e., see FIG. 11) for preventing distortion of data. The ODT circuit may be designed not to operate during the initialization operation of the data storage circuit 1001. The data storage circuit 1001 may also include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 and the buffer memory 1003 or for outputting the data stored in the data storage circuit 1001 and the buffer memory 1003. The memory controller 1002 may include the first semiconductor devices 1 illustrated in FIG. 1. The memory controller 1002 may apply data and a strobe signal for strobing the data to the data storage circuit 1001. The strobe signal outputted from the memory controller 1002 may not be toggled during the initialization operation and may be toggled after the initialization operation terminates. Although FIG. 10 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004.

The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

The semiconductor devices or the semiconductor systems described with reference to FIGS. 1 to 9 may be applied to an electronic system that includes a memory system, a graphic system, a computing system, a mobile system, or the like. For example, as illustrated in FIG. 11, an electronic system 3000 according an embodiment may include a first semiconductor device 3100 and a second semiconductor device 3200.

The first semiconductor device 3100 may apply an external control signal ECTR for controlling an ODT circuit 3220 included in the second semiconductor device 3200 to the second semiconductor device 3200 through a signal line 3300. The first semiconductor device 3100 may not apply the external control signal ECTR to the second semiconductor device 3200 during an initialization operation of the second semiconductor device 3200. The first semiconductor device 3100 may apply transmission data TD to the second semiconductor device 3200.

The second semiconductor device 3200 may include a switch (SW) 3210, the ODT circuit 3220, an input buffer 3230 and an output buffer 3240. The switch (SW) 3210 may receive the external control signal ECTR and may output the external control signal ECTR as a control signal CTR. The ODT circuit 3220 may be turned on in response to the control signal CTR. The ODT circuit 3220 may be turned off during the initialization operation of the second semiconductor device 3200. The input buffer 3230 may receive the transmission data TD, through a signal line 3400, to generate input data DIN during a write operation. The input data DIN may store in memory cells (not illustrated) included in the second semiconductor device 3200 during the write operation. The output buffer 3240 may receive output data DOUT and may output the output data DOUT as the transmission data TD, through the signal line 3400, during a read operation. The output data DOUT may be outputted from the memory cells (not illustrated) included in the second semiconductor device 3200 during the read operation.

What is claimed is:

1. A semiconductor system comprising:
   a first semiconductor device configured for outputting a reset signal, command and address (command/address) signals and data; and
   a second semiconductor device configured to generate internal commands, internal addresses and internal data for performing an initialization operation according to a start signal generated based on the reset signal and configured to store the internal data in a plurality of memory cells selected by the internal commands and the internal addresses during the initialization operation, and
   wherein the start signal is enabled from a point of time that a level of the reset signal is changed till a point of time that all of bits of the internal addresses are counted.

2. The semiconductor system of claim 1, wherein the internal data are stored in the plurality of memory cells to have the same logic level during the initialization operation.

3. The semiconductor system of claim 1, wherein the second semiconductor device is configured to stop receiving the command/address signals and the data while the start signal is enabled.

4. The semiconductor system of claim 1, wherein the second semiconductor device includes:
   a start signal generation circuit configured to generate an oscillation signal including pulses which are periodically created based on the reset signal and configured to generate the start signal which is enabled based on a point of time that a level transition of the reset signal occurs;
   an initialization operation control circuit configured to generate the internal addresses which are sequentially counted and the internal commands which are sequentially counted based on the pulses of the oscillation signal while the start signal is enabled and configured to generate the internal data having a predetermined logic level based on the pulses of the oscillation signal while the start signal is enabled; and
   a memory area configured to include the plurality of memory cells and configured to store the internal data into the plurality of memory cells selected by the internal addresses based on the internal commands.

5. The semiconductor system of claim 4, wherein the start signal generation circuit includes:
   an oscillator configured to generate the oscillation signal including the pulses which are periodically created based on the reset signal; and
   a start signal driving circuit configured to generate the start signal which is enabled based on the oscillation signal and which is disabled if all of bits of the internal addresses are counted.

6. The semiconductor system of claim 5, wherein the start signal driving circuit includes:
   a pulse signal generation circuit configured to generate a pulse signal including a pulse which is created based on the pulses of the oscillation signal being inputted by a predetermined number of times;
   a start signal output circuit configured to generate the start signal which is enabled based on the pulse of the pulse signal and which is disabled based on a detection signal; and
   an address sensing circuit configured to generate the detection signal which is enabled if all of bits of the internal addresses are counted.

7. The semiconductor system of claim 5, wherein the start signal driving circuit includes:
   a pulse signal generation circuit configured to a pulse signal including a pulse which is created based on the pulses of the oscillation signal or a mode set signal;
   a start signal output circuit configured to generate the start signal which is enabled based on the pulse of the pulse signal and which is disabled based on a detection signal; and
   an address sensing circuit configured to generate the detection signal which is enabled if all of bits of the internal addresses are counted.

8. The semiconductor system of claim 7, wherein the pulse signal generation circuit includes:
   a boot-up signal generation circuit configured to generate a boot-up signal including a pulse which is created based on the pulses of the oscillation signal being inputted by a predetermined number of times;
   a test mode signal generation circuit configured to generate a test mode signal including a pulse which is created based on the mode set signal; and
   a logic circuit configured to execute a logical OR operation of the boot-up signal and the test mode signal to generate the pulse signal.

9. The semiconductor system of claim 4, wherein the initialization operation control circuit includes:
   an internal signal generation circuit configured to generate addresses and commands that are sequentially counted and storage data having a predetermined logic level, based on the pulses of the oscillation signal while the start signal is enabled; and
   an input control circuit configured to output the addresses or some bits of the command/address signals as the internal addresses, configured to output the commands or some other bits of the command/address signals as the internal commands, and configured to output the storage data or the data as the internal data, based on the start signal.

10. The semiconductor system of claim 9, wherein the internal signal generation circuit includes:
    an address generation circuit configured to generate the addresses that are sequentially counted based on the pulses of the oscillation signal while the start signal is enabled;
    a command generation circuit configured to generate the commands based on the pulses of the oscillation signal while the start signal is enabled; and a data generation circuit configured to generate the storage data having a predetermined logic level based on the pulses of the oscillation signal while the start signal is enabled.

11. The semiconductor system of claim 10, wherein the data generation circuit comprises:
a buffer circuit configured to inversely buffer a ground voltage or a power supply voltage and to output an inversely buffered voltage based on the start signal; and
a first latch configured to receive the output of the buffer circuit and inversely buffer and latch the output of the buffer circuit to generate the storage data.

12. The semiconductor system of claim 10, wherein the data generation circuit comprises:
a node;
a first driving circuit coupled to the node and configured to pull up the node to a power supply voltage based on the start signal; and
a second latch circuit coupled to the node and configured to inversely buffer and latch a signal of the node to generate the storage data based on pulses of the oscillation signal.

13. The semiconductor system of claim 10, wherein the data generation circuit comprises:
a node;
a second driving circuit coupled to the node and configured to pull down the node to a ground voltage based on the start signal; and
a third latch circuit coupled to the node and configured to inversely buffer and latch a signal of the node to generate the storage data based on pulses of the oscillation signal.

14. The semiconductor system of claim 9, wherein the input control circuit includes:
a first transmission circuit configured to output the addresses or some bits of the command/address signals as the internal addresses based on the start signal;
a second transmission circuit configured to output the commands or some other bits of the command/address signals as the internal commands based on the start signal; and
a third transmission circuit configured to output the storage data or the data as the internal data based on the start signal.

15. A semiconductor device comprising:
a start signal generation circuit configured to generate an oscillation signal including pulses which are periodically created based on a reset signal during an initialization operation and configured to generate a start signal which is enabled at a point of time that a level transition of the reset signal occurs; and
an initialization operation control circuit configured to generate internal addresses and internal commands which are sequentially counted based on the pulses of the oscillation signal while the start signal is enabled and configured to generate internal data having a predetermined logic level based on the pulses of the oscillation signal while the start signal is enabled.

16. The semiconductor device of claim 15, wherein the start signal is enabled from a point of time that a level of the reset signal is changed till a point of time that all of bits of the internal addresses are counted.

17. The semiconductor device of claim 15, wherein the start signal generation circuit includes:
an oscillator configured to generate the oscillation signal including the pulses which are periodically created based on the reset signal; and
a start signal driving circuit configured to generate the start signal which is enabled based on the oscillation signal and which is disabled if all of bits of the internal addresses are counted.

18. The semiconductor device of claim 17, wherein the start signal driving circuit includes:
a pulse signal generation circuit configured to generate a pulse signal including a pulse which is created based on the pulses of the oscillation signal being inputted by a predetermined number of times;
a start signal output circuit configured to generate the start signal which is enabled based on the pulse of the pulse signal and which is disabled based on a detection signal; and
an address sensing circuit configured to generate the detection signal which is enabled if all of bits of the internal addresses are counted.

19. The semiconductor device of claim 15, wherein the initialization operation control circuit includes:
an internal signal generation circuit configured to generate addresses and commands that are sequentially counted and storage data having a predetermined logic level, based on the pulses of the oscillation signal while the start signal is enabled; and
an input control circuit configured to output the addresses or some bits of command/address signals as the internal addresses, configured to output the commands or some other bits of the command/address signals as the internal commands, and configured to output the storage data or data as the internal data, based on the start signal.

20. The semiconductor device of claim 19, wherein the internal signal generation circuit includes:
an address generation circuit configured to generate the addresses that are sequentially counted based on the pulses of the oscillation signal while the start signal is enabled;
a command generation circuit configured to generate the commands based on the pulses of the oscillation signal while the start signal is enabled; and
a data generation circuit configured to generate the storage data having a predetermined logic level based on the pulses of the oscillation signal while the start signal is enabled.

21. The semiconductor device of claim 19, wherein the input control circuit includes:
a first transmission circuit configured to output the addresses or some bits of the command/address signals as the internal addresses based on the start signal;
a second transmission circuit configured to output the commands or some other bits of the command/address signals as the internal commands based on the start signal; and
a third transmission circuit configured to output the storage data or the data as the internal data based on the start signal.

22. The semiconductor device of claim 15,
a first memory area configured to include a plurality of first memory cells and configured to store the internal data into the plurality of first memory cells selected by the internal addresses based on the internal commands; and
a second memory area configured to include a plurality of second memory cells and configured to store the internal data into the plurality of second memory cells selected by the internal addresses based on the internal commands.

\* \* \* \* \*